United States Patent
Taniguchi et al.

(10) Patent No.: US 6,956,505 B2
(45) Date of Patent: Oct. 18, 2005

(54) SIGNAL PROCESSING APPARATUS FOR ENCODER

(75) Inventors: Mitsuyuki Taniguchi, Gotenba (JP); Tokuhisa Matsukane, Yamanashi (JP)

(73) Assignee: Fanuc LTD, Yamanashi (JP)

( * ) Notice: Subject to any disclaimer, the term of this patent is extended or adjusted under 35 U.S.C. 154(b) by 122 days.

(21) Appl. No.: 10/334,791

(22) Filed: Jan. 2, 2003

(65) Prior Publication Data

US 2003/0160160 A1 Aug. 28, 2003

(30) Foreign Application Priority Data

Feb. 28, 2002 (JP) ........................................ 2002-054674

(51) Int. Cl.$^7$ ............................................. H03M 1/22
(52) U.S. Cl. ......................................................... 341/11
(58) Field of Search ................................ 341/9, 13, 15, 341/17, 11, 12, 14; 250/231 SE; 318/652; 324/208, 252

(56) References Cited

U.S. PATENT DOCUMENTS

| | | | | |
|---|---|---|---|---|
| 4,998,105 A | * | 3/1991 | Takekoshi et al. | 341/13 |
| 6,191,415 B1 | | 2/2001 | Stridsberg | |
| 6,380,927 B1 | * | 4/2002 | Ostrum et al. | 345/165 |
| 6,399,940 B1 | * | 6/2002 | Cui et al. | 250/231.13 |
| 2001/0010500 A1 | | 8/2001 | Lundin et al. | |

FOREIGN PATENT DOCUMENTS

| | | |
|---|---|---|
| EP | 10-311741 | 11/1998 |
| JP | 1-156403 | 10/1989 |
| JP | 02-105013 | 4/1990 |
| JP | 02-195208 | 8/1990 |
| JP | 03-042508 | 2/1991 |
| JP | 04-359107 | 12/1992 |
| JP | 05-034145 | 2/1993 |
| JP | 05-087589 | 4/1993 |
| JP | 05-089480 | 4/1993 |
| JP | 05-296793 | 11/1993 |
| JP | 08-159808 | 6/1996 |
| JP | 63-015115 | 1/1998 |
| JP | 10-185624 | 7/1998 |
| JP | 2002-286506 | 10/2002 |
| WO | WO97/07382 | 2/1997 |
| WO | WO98/21553 | 5/1998 |
| WO | 00/28283 | 5/2000 |

OTHER PUBLICATIONS

Notice of Grounds of Rejection for corresponding Japanese Application 2002–054764 dated Jan. 19, 2005.
Notice of Grounds for Rejection for Related Japanese Application No. 2002–054674 mailed Mar. 23, 2004.
European Search Report date Mar. 1, 2004.

* cited by examiner

*Primary Examiner*—Brian Young
(74) *Attorney, Agent, or Firm*—Staas & Halsey LLP

(57) ABSTRACT

After cyclic original signals generated from a sensing element of an encoder are converted into digital signals, positions P(0) to P(n) in one period are obtained for each given period by means of a digital interpolator. If position data obtained immediately after a zero cross point is detected are P(0) and P(n) and if speed is fixed, an object should move on a straight line from a position P(0) to a position P(n). An actual detected position data P(m) is deviated from this straight line by D(m). This detection error D(m) and the detected position data P(m) are combined and stored in advance as reference data, and correction is carried out using the reference data every time position data is detected by the digital interpolator.

19 Claims, 7 Drawing Sheets

$Ps(0) \rightarrow D(0)$
$Ps(1) \rightarrow D(1)$
$\vdots$
$Ps(m) \rightarrow D(m)$
$\vdots$
$Ps(n) \rightarrow D(n)$

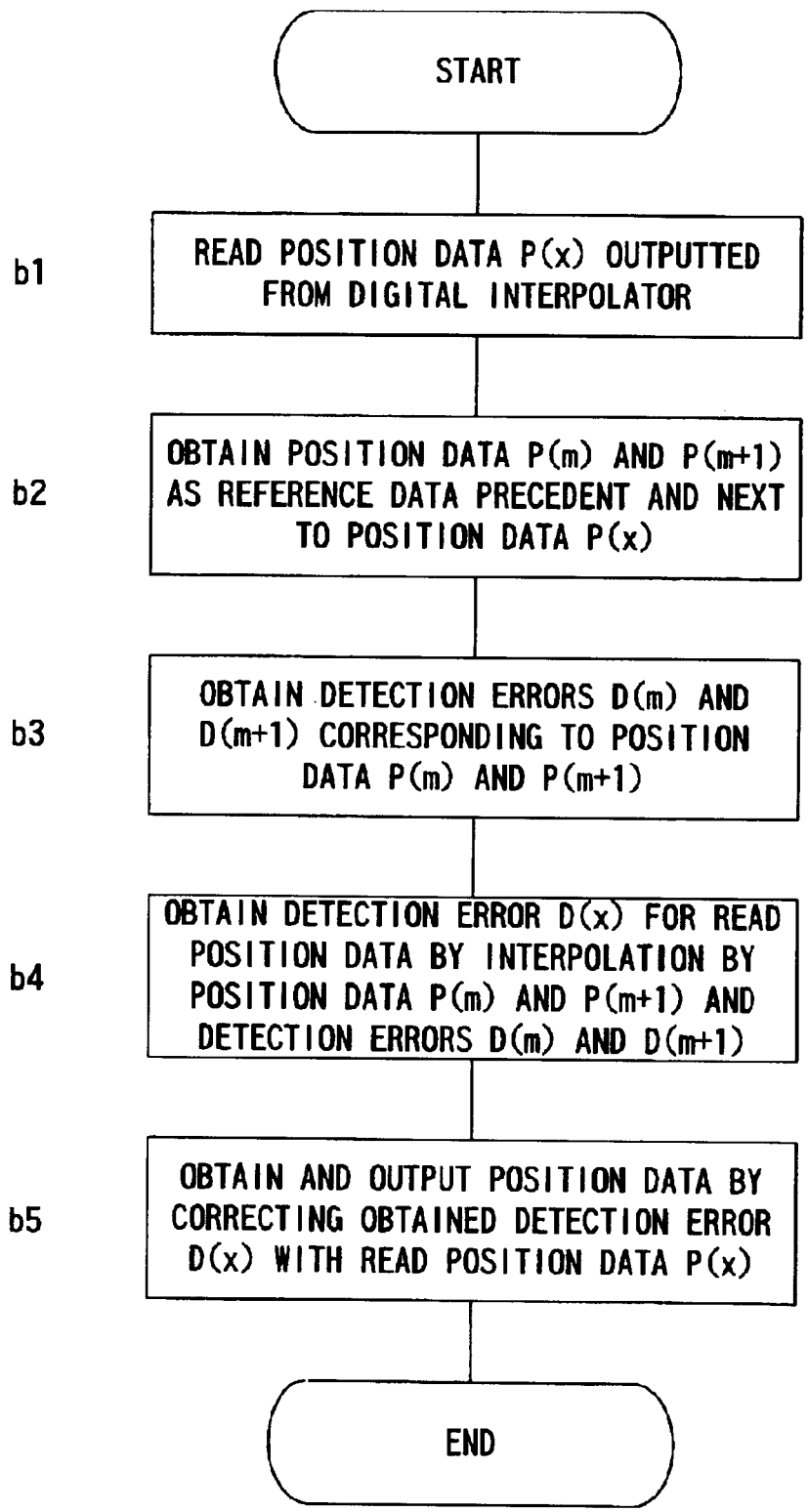

SIGNAL PROCESSING APPARATUS FOR ENCODER

BACKGROUND OF THE INVENTION

1. Field of the Invention

The present invention relates to a signal processing apparatus for interpolating detection signals of encoders including a rotary encoder for detecting the rotational position of a motor of a machine tool such as an NC device, a linear scale for detecting the linear movement position of a table, etc.

2. Description of the Prior Art

FIG. 1 is a block diagram showing a position and angle detecting method for a conventional encoder. Original signals of a sine wave Sa and a cosine wave Sb that are delivered from a sensing element of the encoder are amplified by means of analog amplifiers 1a and 1b so that they may match the respective inputs of analog-digital converters 2a and 2b in the next stage. An analog amplifier 7 corrects the offset, amplitude difference, and phase difference of the amplified original signals Sa and Sb, thereby approximating the sine and cosine waves to ideal ones. The analog signals are converted digital signals by means of the analog-digital converters 2a and 2b, and positions in each original-signal period (each sine-wave period) are calculated by means of a digital interpolator 3. A position data generator 6 originates and outputs position data in accordance with calculated position data for one period and data in a counter (not shown in this block diagram) that counts the periods of the original signals.

Described in Japanese Patent Application Laid-Open No. 10-311741, moreover, is a method in which position data adjusted in offset and amplitude are obtained in a manner such that the original signals from the sensing element of the encoder are converted into digital signals, and the offset value and amplitude ratio are obtained in accordance with the converted digital signals.

The above-described method that is used in the conventional encoder and employs the analog circuits for the adjustment of offset voltage, amplitude difference, and phase difference requires large-sized circuits, so that it is subject to the problems of a wider packaging area and higher cost. Further, the method has problems that it cannot remove waveform distortion (harmonic component) and that it cannot cope with waveform changes attributable to temperature fluctuations during operation and waveform changes with time. The aforesaid method described in Japanese Paten Application Laid-Open No. 10-311741, moreover, serves for the adjustment of offset and amplitude, and involves no consideration of the adjustment of phase difference.

OBJECT AND SUMMARY OF THE INVENTION

The object of the present invention is to provide a signal processing apparatus for an encoder, enjoying a reduced packaging area and capable of adjusting its offset voltage, amplitude difference, and phase difference and removing waveform distortion.

In order to achieve the above object, a signal processing apparatus for an encoder according to the present invention comprises: position data acquiring means for sampling analog signals cyclically generated from an encoder coupled to an object to be measured with every given time in response to movement of the object to be measured and detecting and acquiring position data for the encoder; storage means for obtaining error data corresponding to a plurality of detected position data from the individual detected position data and ideal position data obtained on the supposition that the position linearly changes within each period of the analog signal and storing the detected position data and the error data as reference data; and correction means for obtaining detection error data by using the reference data stored in the storage means for the detected position data acquired by means of the position data acquiring means, thereby correcting the detected position data with use of the obtained detection error data.

The signal processing apparatus for an encoder according the present invention may enjoy the following aspects.

The correction means obtains a detection error corresponding to the detected position data acquired by means of the position data acquiring means by interpolating the reference data stored in the storage means.

The correction means obtains a detection error corresponding to the detected position data acquired by means of the position data acquiring means by interpolating position data precedent and next to the detected position data contained in the reference data and detection error data corresponding to the position data.

The apparatus further comprises detection error data calculating means for setting and storing a combination of the detected position data and the detection error data corresponding to these detected position data as the reference data in the storage means, assuming that the detection error data is obtained as the difference between the ideal position data and the detected position data and the ideal position data is obtained on the supposition that position data linearly changes as the object to be measured moves from a predetermined position to a position corresponding to the lapse of one period.

The detection error data calculating means includes moving speed detecting means for obtaining the moving speed of the object to be measured and obtains the reference data when a predetermined speed is detected by means of the moving speed detecting means.

The position data acquiring means obtains the detection error data by acquiring (n+1) number of detected position data P(0) to P(n) (n≧2) for three or more points that divide the one period into at least two regions when the object to be measured is moving at a predetermined speed containing speed fluctuations below a predetermined level.

Error data D(m) for m-th obtained position data P(m) (0<m<n) out of the (n+1) number of detected position data P(0) to P(n) (n≧2) is obtained according to the following equation:

$$D(m)=P(m)-[P(0)+\{P(n)-P(0)\}\times m/n].$$

The error data calculating means obtains a time tA for the passage of a set position PA from two consecutive position data P(0) and P(1) detected before and after the passage of the set position PA, obtains a time tB for the passage of a set position PB from two consecutive position data P(n) and P(n+1) detected before and after the passage of the set position PB ahead of the set position PA by the one period, and obtains detection error data D(m) for m-th detected position data P(m) (1≦m≦n) out of a detected position data group P(1) to P(n) according to the following equation:

$$D(m)=P(m)-[PA+(PB-PA)\times(tm-tA)/(tB-tA)],$$

where tm is the time when the position data is detected.

The apparatus further comprises detection error data calculating means for setting and storing a combination of the detected position data and the detection error data corresponding to these detected position data as the reference data in the storage means, by considering a plurality of position data, which is obtained on the supposition that position linearly changes with respect to time for one period from a predetermined position to a position corresponding to the lapse of one period, as ideal position data, and obtaining position data corresponding to the ideal position data from the detected position data, and then considering the difference between the obtained position data and the ideal position data as detected error data.

The detection error data calculating means includes moving speed detecting means for obtaining the moving speed of the object to be measured and obtains the reference data when a predetermined speed is detected by means of the moving speed detecting means.

The position data acquiring means obtains the detection error data by acquiring (n+1) number of detected position data $P(0)$ to $P(n)$ ($n \geq 2$) for three or more points that divide the one period into at least two regions when the object to be measured is moving at a predetermined speed containing speed fluctuations below a predetermined level.

The error data calculating means obtains a time tA for the passage of a set position PA from two consecutive position data $P(0)$ and $P(1)$ detected before and after the passage of the set position PA, obtains a time tB for the passage of a set position PB from two consecutive position data $P(n)$ and $P(n+1)$ detected before and after the passage of the set position PB ahead of the set position PA by the one period, obtains a time tX for the passage of an optional position PX from detected position data $P(m)$ and $P(m+1)$ which allow $P(m) \leq PX \leq P(m+1)$ or $P(m) \leq PX \leq P(m+1)$ to hold, obtains detection error DX for the position PX according to the following equation, obtains detection error data corresponding to a plurality of different positions for the optional position PX, and stores the detection error data corresponding to the individual positions PX as the reference data:

$$DX=PX-[PA+(PB-PA)\times(tX-tA)/(tB-tA)].$$

The error data calculating means divides the region between the position PA and the position PB into an optional number of equal parts, obtains the divisional positions and detection error data for the divisional positions, and set the detection error data corresponding to the divisional position data as the reference data.

The position data acquiring means obtains (n+1) number of consecutively detected position data $P(0)$ to $P(n)$ ($n \geq =2$) for at least three points in the one period, obtains a detection error for a third optional point between $P(0)$ to $P(n)$ by frequency analysis, and corrects the position data in accordance with the obtained error data.

The speed detecting means detects speed by the difference between position data $P(-1)$ for the last cycle of sampling and position data $P(0)$ for the present cycle of sampling, and the detection error data calculating means obtains the reference data when a predetermined range is attained by the detected speed.

The error data calculating means includes means for obtaining acceleration from the difference between the difference between position data $P(-1)$ for the last cycle of sampling and position data $P(0)$ for the present cycle of sampling, detected by means of the speed detecting means, and the difference between position data $P(-2)$ for the before-last cycle of sampling and the position data $P(-1)$ for the last cycle of sampling, and obtains the reference data when predetermined ranges are attained by the detected speed and also by the detected acceleration, respectively.

The error data calculating means starts acquisition of the reference data when a predetermined range is attained by a difference $V(0)$ between position data $P(-1)$ for the last cycle of sampling and position data $P(0)$ for the present cycle of sampling, a predetermined range is attained by the difference between the difference $V(0)$ and a difference $V(-1)$ between position data $P(-2)$ for the before-last cycle of sampling and the position data $P(-1)$ for the last cycle of sampling, and also predetermined ranges are attained by a difference $V(n-1)$ between $P(n-2)$ and $P(n-1)$ and the difference $V(n)$ between $P(n-1)$ and $P(n)$.

The error data calculating means starts acquisition of the reference data when an acquisition start command for the reference data is delivered from a controller for controlling the apparatus fitted with the encoder.

The detection error data stored as the reference data is an average of the detection error data calculated a plurality of times in the past or filtered data.

According to the present invention, detection errors involved in detected positions obtained by sampling the respective one-period positions of cyclically generated original signals are obtained, and the detection errors are corrected for the sampled detected positions and used as detected position data for one period. Therefore, the corrected detected position data are cleared of waveform distortion with the offset voltage, amplitude difference, and phase difference corrected, so that accurate positions for one period can be obtained. Further, waveform changes attributable to temperature fluctuations during operation and error fluctuations attributable to waveform changes with time can be also removed automatically. Since the apparatus is composed of a digital circuit, moreover, its packaging area can be made much smaller than that of an apparatus that is composed of an analog circuit.

BRIEF DESCRIPTION OF THE DRAWINGS

FIG. 11 is a processing flowchart showing processes according to an embodiment in which a processor is used to correct detection errors to obtain position data for one period.

DETAILED DESCRIPTION OF THE PREFERRED EMBODIMENTS

Figure 1:
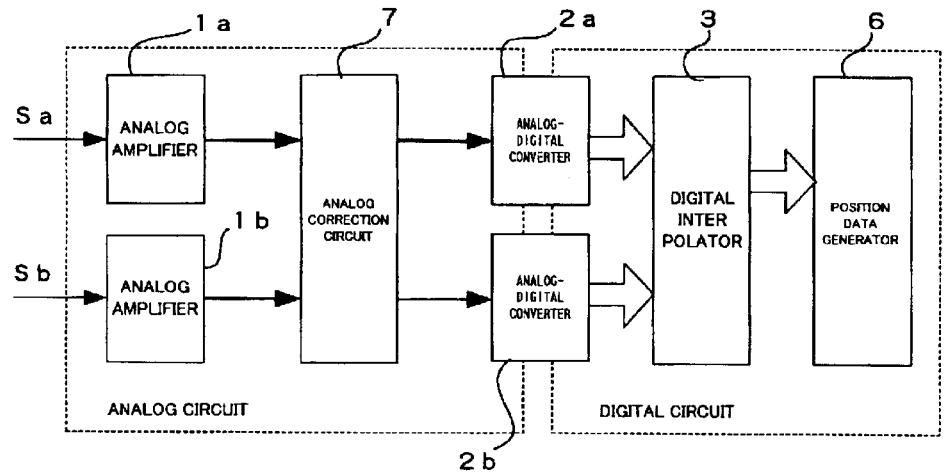
FIG. 1 is a block diagram showing a position and angle detecting method for a conventional encoder.
Figure 2:
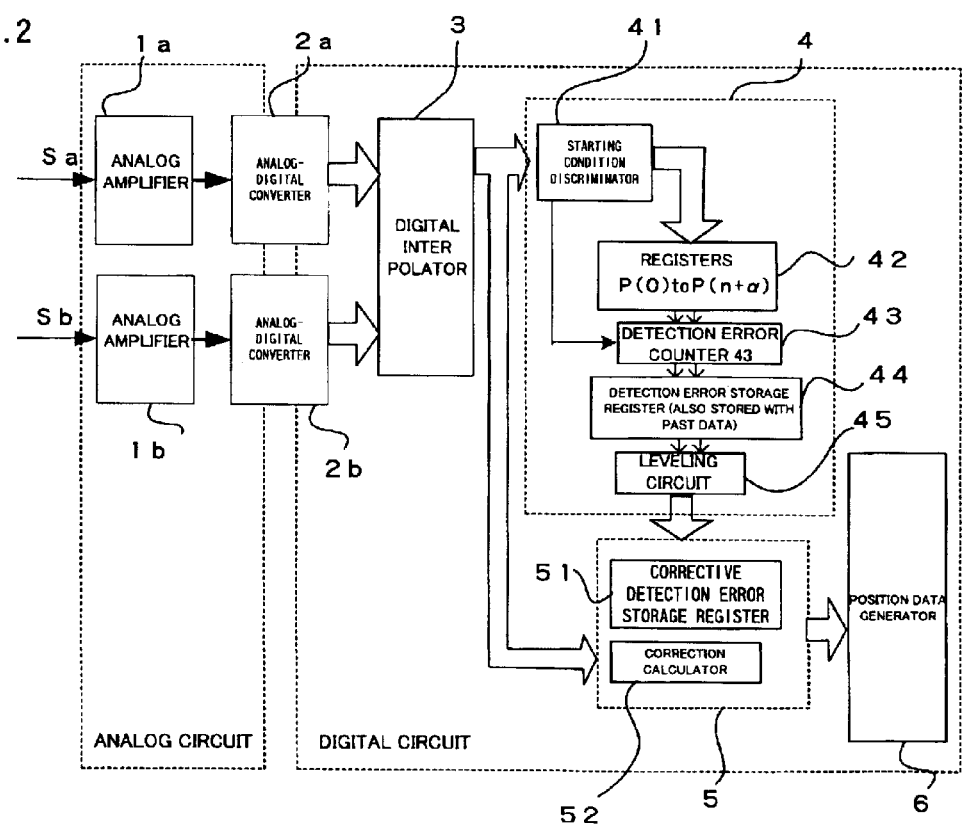
FIG. 2 is a block diagram showing an embodiment of the present invention.

FIG. 2 is block diagram showing an embodiment of the present invention. In the present embodiment, original signals of a sine wave Sa and a cosine wave Sb that are delivered from a sensing element of an encoder are amplified by means of analog amplifiers 1a and 1b so that they match the respective inputs of analog-digital converters 2a and 2b in the next stage. The amplified analog signals are converted into digital signals by means of the analog-digital converters 2a and 2b with every fixed sampling period. A digital interpolator 3 calculates positions in each original-signal period (each sine-wave period) according to the converted digital values, delivers it to a detection error data calculator 4.

The detection error data calculator 4 comprises a starting condition discriminator 41, register group 42, error counter 43, detection error storage register 44, and leveling circuit 45. The starting condition discriminator 41 receives position data from the digital interpolator 3, and determines whether or not starting requirements are fulfilled. If the requirements are fulfilled, sampled position data P(0) to P(n+α) a little more than samples for each original-signal period are loaded into the register group 42. Sampling is made n number of times for each period.

The detection error counter 43 calculates detection error data for equal-distance positions in one period from the state of the position data P(0) to P(n+α) stored in the register group 42. Further, the detection error storage register 44 stores the calculated detection error data for past several times. These past detection error data stored in the detection error storage register 44 are leveled by means of the leveling circuit 45, and detection error data on the resulting average value is loaded into a corrective detection error storage register 51 of a detection error correction circuit 5. An average of a plurality of detection error data is taken in order to improve the accuracy of the detection error data. For simplicity, the detection error data obtained in the detection error counter 43 may be loaded directly into the corrective detection error storage register 51 without using the detection error storage register 44 and the leveling circuit 45.

The detection error correction circuit 5 is composed of the corrective detection error storage register 51 and a correction calculator 52. The correction calculator 52 calculates detection errors of position data delivered from the digital interpolator 3 by the use of detection error data stored in the corrective detection error storage register 51, and corrects and delivers the position data to a position data generator 6. The position data generator 6 originates position data in accordance with corrected position data for one period and data in a counter (not shown in this block diagram) that counts the periods of the original signals.

Figure 3:
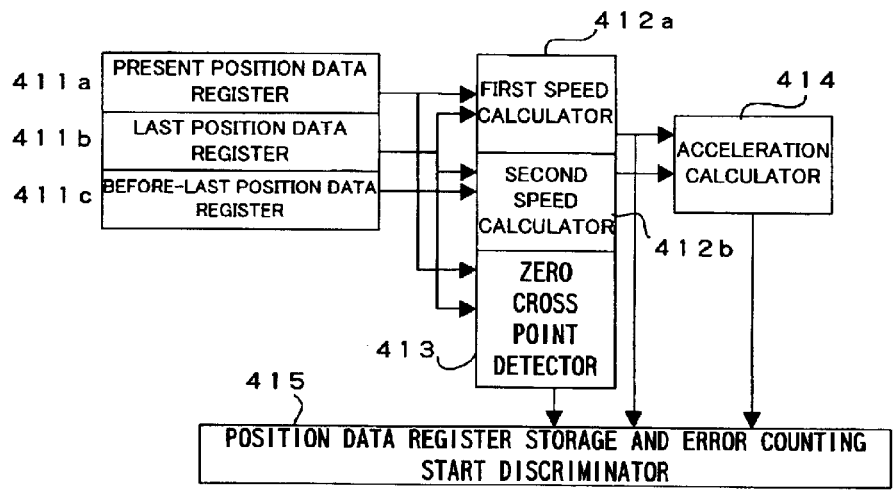
FIG. 3 is a detailed block diagram showing a starting condition discriminator in the embodiment.

FIG. 3 is a detailed block diagram of the starting condition discriminator 41. The starting condition discriminator 41 comprises three position data registers 411a, 411b and 411c, first and second speed calculators 412a and 412b, zero cross point detector 413, acceleration calculator 414, and position data register storage and error counting start discriminator 415.

Position data for each given sampling period, delivered from the digital interpolator 3, is loaded into a present position data register 411a. Position data having so far been stored in the present position data register 411a is loaded into a last position data register 411b. Position data having so far been stored in the last position data register 411b is loaded into a before-last position data register 411c. Thus, the position data are shifted every time each position data is delivered from the digital interpolator 3 (with every sampling period), and the position data for the present, last, and before-last sampling periods are stored.

The first speed calculator 412a obtains a present speed from the difference between present position data stored in the present position data register 411a and position data stored in the last position data register 411b. The second speed calculator 412b obtains a last-period present speed from the difference between position data stored in the last position data register 411b and the before-last position data register 411c. The acceleration calculator 414 obtains acceleration from the difference between speeds obtained by means of the first and second speed calculators 412a and 412b.

Based on the position data stored in the present position data register 411a and the before-last position data register 411b, the zero cross point detector 413 detects a zero cross point at which each period for the original signals Sa and Sb starts.

On the supposition that conditions for setting and fetching the position data are met, the position data register storage and error counting start discriminator 415 loads the register group 42 with position data P(0) to P(n+a) for one or more original-signal periods that cover the zero cross point and the next zero cross point when the zero cross point is detected by means of the zero cross point detector 413. When the next zero cross point is detected, moreover, an error counting start signal is delivered to the detection error counter.

The conditions for position data fetching include:

(1) that the speed (difference between position data P(−1) and P(0)) obtained by means of the first speed calculator 412a is within a given range;

(2) that the acceleration (difference between the difference between position data P(−2) and P(−1) and the difference between P(−1) and P(0)) obtained by means of the acceleration calculator 414 is within a predetermined range when the accuracy is to be improved; and (3) that the detected acceleration (difference between the difference between position data P(n−2) and P(n−1) and the difference between P(n−1) and P(n)) is within a predetermined range at the end of one original-signal period.

The above is a description of the configuration of the principal part of a signal processing apparatus of the encoder according to the present embodiment.

The following is a description of various embodiments of a method of detection error correction.

A first embodiment of the present invention will first be described with reference to FIG. 4.

Figure 4:
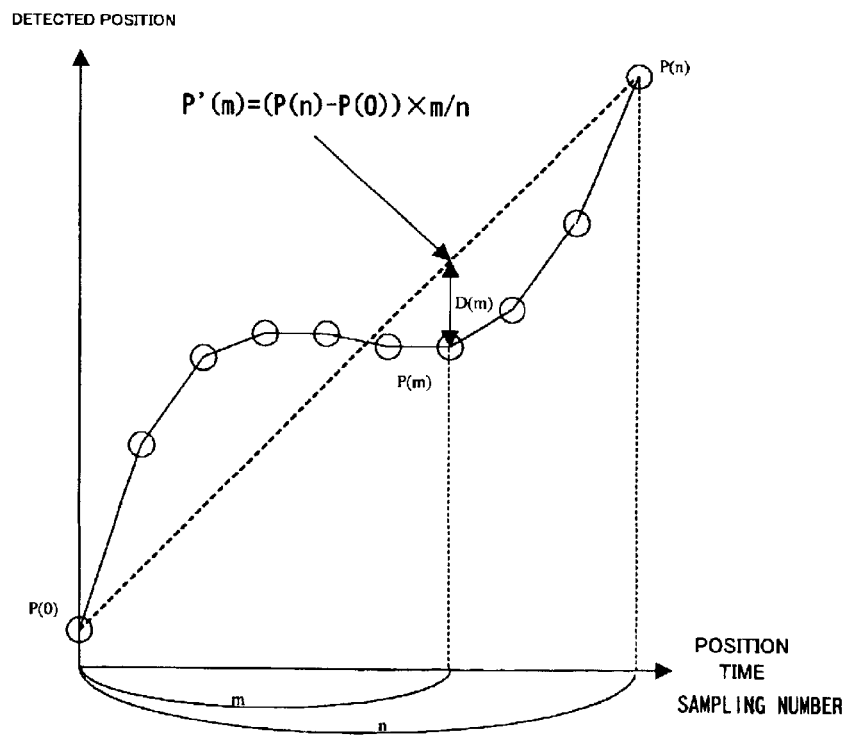
FIG. 4 is a diagram showing a first embodiment of the invention.

Let it be supposed that position data for each original-signal period are obtained by sampling the data n number of times for each original-signal period in FIG. 4. More specifically, the sampling period is given by Ts, and the moving speed of a moving element (rotating element) that is fitted with the sensing element of the encoder is supposed to be a constant speed v. If the movement (rotational angle) of the moving element for each period is L, moreover, L is given by L=n·Ts·v. If the first sampling time after the detection of the zero cross point is 0, position data obtained by sampling at time 0 is P(0), and position data obtained at the first sampling time after the detection of the next zero cross point is P(n), then, the time interval that elapses from the instant that the position data P(0) is obtained until the position data P(n) is obtained is substantially equivalent to each period (P(n)−P(0)=L).

In FIG. 4, the axes of abscissa and ordinate represent the time base and detected position, respectively. Circles on a wavy curve in this drawing are obtained by plotting n number of sampled position data in each period. Since the detected position data are repeatedly detected from movement 0 to L, as shown in FIG. 4 (and in FIGS. 6, 7 and 8 mentioned later), position data at movement L in one period is regarded as position data at movement 0 in the following period, and such position data lie on a straight line.

The position data are obtained with every sampling period Ts. Since the speed v and the sampling period Ts are constant, a distance d of movement between samplings is constant (=v. Ts). Thus, the axis of abscissa of FIG. 4 also represents the distance of movement (rotational angle) of the moving element. When m-th sampling is carried out, the time m·Ts has elapsed, or the moving element has moved by distance d=m·v·Ts, from the time when position data P(0) had been obtained.

The moving element moves a distance L, corresponding to one original-signal period, at a uniform speed v, during which n samplings are carried out with a sampling period Ts. Therefore, the position changes linearly, and the distance d of movement at m-th sampling is L·m/n. If position data P(n) is data obtained after the elapse of just one original-signal period from the time when position data (0) is obtained, the position data ought to lie on a broken straight line of. FIG. 4 that connects the position data P(0) and P(n). The broken straight line shown in FIG. 4 represents the position to be detected while moving for one period. If the position actually detected by sampling is a position P(m) indicated by a circle in FIG. 4, however, a detection error D(m) is given by $$D(m) = P(m) - [P(0) + L \cdot m/n] \quad (1)$$
$$= P(m) - [P(0) + \{P(n) - P(0)\} \times m/n].$$

Figures 5, 6:
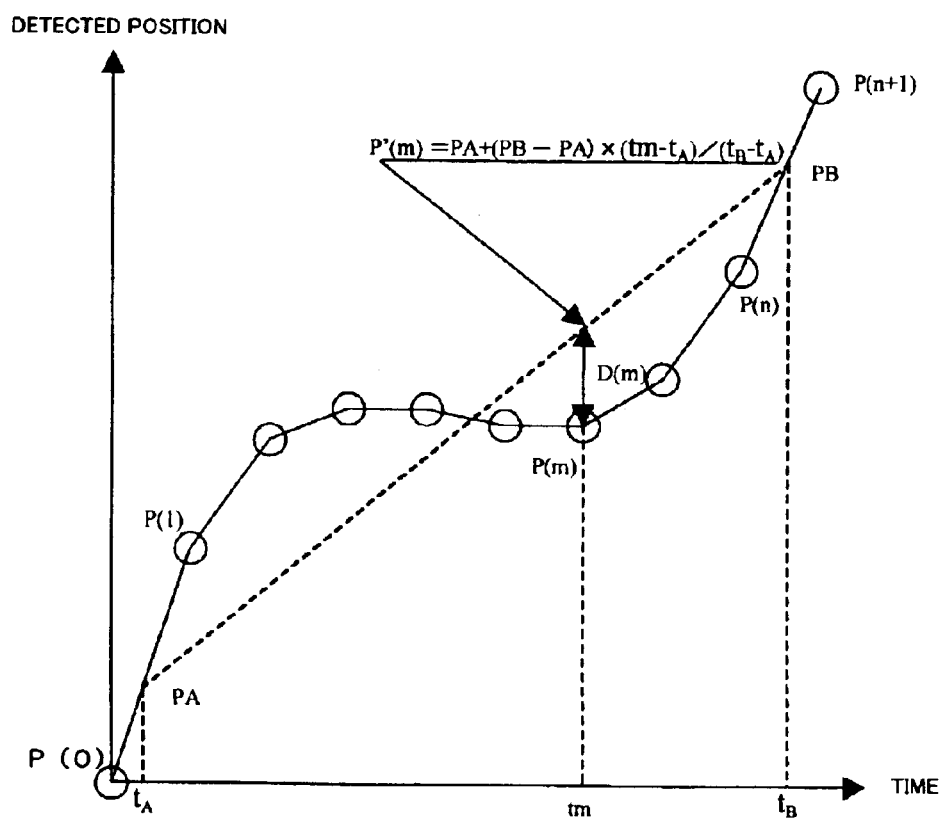
FIG. 5 is a diagram illustrating reference data.
FIG. 6 is a diagram showing a second embodiment of the invention.

Thereupon, the detected position data P(m) for each sampling position m (=0, 1, 2, ... ) and the detection error D(m) obtained in each sampling position are stored correspondingly as a reference position data Ps(m) and a reference detection error D(m), respectively, as shown in FIG. 5. More specifically, the position data P(0) to P(n) for each period stored in the register group 42 of FIG. 2 are subjected to computation given by equation (1) to obtain detection errors D(0) to D(n), individually, by means of the detection error counter 43. In the case of this example, the detection errors D(0) to D(n) obtained by means of the detection error counter 43 are loaded as reference data [Ps(0) to Ps(n), D(0) to D(n)] into the corrective detection error register 51 without being leveled in a manner such that they correspond to the detected position data P(0) to P(n), respectively.

Thereafter, the correction calculator 52 compares position data P(x) delivered from the digital interpolator 3 and the reference position data Ps(0) to Ps(n) stored in the corrective detection error register 51. If the detected position data P(x) is intermediate between the reference position data Ps(m) and Ps(m+1) stored in the corrective detection error register 51, a detection error D(x) corresponding to the detected position data P(x) is obtained by interpolative calculation according to detection error data D(m) and D(m+1) that are stored corresponding to the reference position data Ps(m) and Ps(m+1), respectively. This point will be described later.

On the supposition that the detected position data P(x) has the detection error D(x) obtained in this manner, the correction calculator 52 subtracts the detection error D(x) from the detected position data P(x) for correction, and outputs the resulting data as position data for one period.

According to the embodiment described above, the difference [P(n)–P(0)] between the detected position data P(0) and P(n) for the first sampling time since the detection of the zero cross point is regarded as the movement L for each period between the data P(0) and P(n). Actually, however, the detected position data P(0) and P(n) are not always at the same distance from the zero cross point, and the distance between these two positions is not always equal to the movement L for each period. Thus, the accuracy lowers by a margin for the approximation.

A second embodiment of the present invention that solves the aforesaid problem will be described with reference to FIG. 6.

In order to improve the accuracy, according to this embodiment, the detection errors D(0) to D(n) that serve as reference data are obtained according to positions PA and PB corresponding to the opposite ends of an optionally set period, without regard to the positions detected for each sampling period. The difference between the set positions PA and PB is set to be equal to the movement L for each period. As sampling position data to be loaded into the registers 42, position data P(0) to P(n+1) are loaded so as to include the set positions PA and PB. If $P(0) \leq PA \leq P(1)$ or $P(0) \geq PA \geq P(1)$ is given, for example, the sampling position data are loaded so that a relation $P(n) \leq PB \leq P(n+1)$ or $P(n) \geq PB \geq P(n+1)$ is established. If PA=0 and PB=L (=0) are given, for ease of understanding, then the starting and ending points of one original-signal period can be considered to have been designated.

FIG. 6 is a diagram obtained by plotting the sampling position data P(0) to P(n+1). In this diagram, the axis of abscissa represents time, the axis of ordinate represents the detected position, and the origin of the time base represents the point of time when the position data P(0) is detected. A time tA corresponding to the set position PA is obtained by interpolative calculation based on the sampling position data P(0) and P(1) on the opposite sides of the set position PA, the set position PA, and the sampling period Ts.

Likewise, a time tB corresponding to the set position PB is obtained according to a time n Ts for sampling the position data P(n) and a value (time) that is obtained by interpolative calculation based on the sampling position data P(n) and P(n+1) on the opposite sides of the set position PB, the set position PB, and the sampling period Ts.

Since the position changes linearly in case of uniform-speed movement, a straight line (broken straight line shown in FIG. 6) that connects points (tA, PA) and (tB, PB) thus obtained represents ideal positions for the detection of the position data.

The m-th data P(m), out of the position data group, is position data detected in the m-th cycle of sampling tm (=m·Ts), and an ideal position P'(m) for the position P(m) to be detected is obtained according to the following equation (2) that is represented by a broken straight line:

$$P'(m) = PA + (PB - PA) \times (tm - tA)/(tB - tA). \quad (2)$$

The detection error D(m) is obtained according to the following equation (3):

$$D(m) = P(m) - P'(m) \quad (3)$$
$$= P(m) - [PA + (PB - PA) \times (tm - tA)/(tB - tA)].$$

The detection error counter 43 carries out the computation of equation (3), thereby obtaining the detection errors D(0) to D(n). As reference position data, the sampling position data P(0) to P(n) are loaded in combination with the detection errors D(0) to D(n) into the corrective detection error storage register 51. The detection errors D(0) to D(n) need not be obtained for all the position data P(0) to P(n). The detection errors D(0), D(2), D(4), . . . may be obtained corresponding to selected position data, e.g., even-numbered sampling position data P(0), P(2), P(4), . . . , as reference position data. In this case, these detection errors are loaded as a set of reference data into the corrective detection error storage register 51.

In detection error correction, the correction calculator 52 compares the position data P(x) delivered from the digital interpolator 3 and the position data P(0) to P(n) stored in the corrective detection error register 51, as mentioned before, obtains position data precedent and next to the detected position data P(x), and obtains a detection error by interpolative calculation based on the obtained position data.

The correction calculator 52 subtracts the detection error D(x) thus obtained from the detected position data P(x) for correction, and outputs the resulting data.

Although the detection error data D(0) to D(n) are obtained corresponding to the sampled detected position data P(0) to P(n) according to the first and second embodiments described above, they may alternatively be obtained for each optional position.

Figure 7:
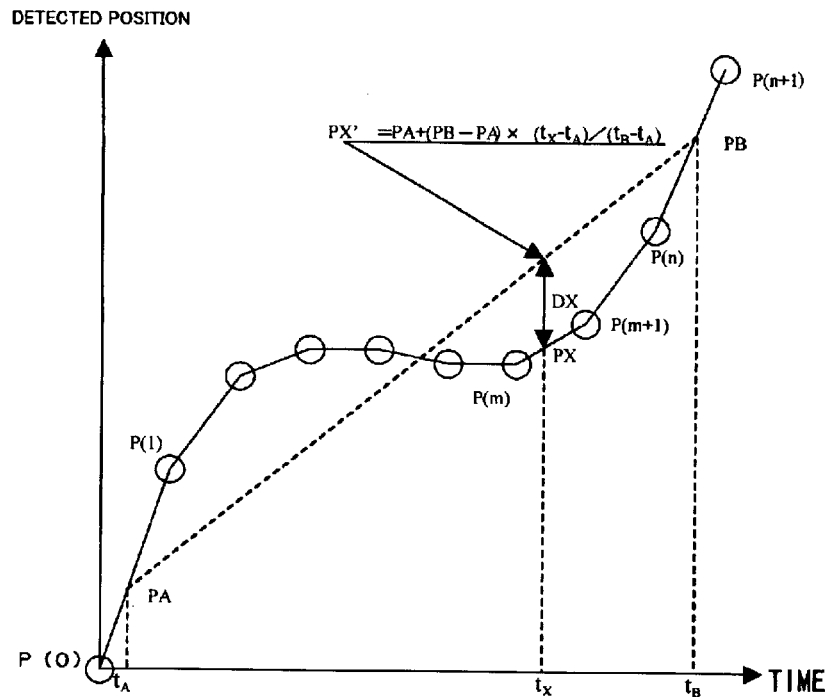
FIG. 7 is a diagram showing a third embodiment of the invention.

An example of this arrangement will now be described as a third embodiment of the present invention with reference to FIG. 7.

According to this embodiment, the detection errors are obtained for optional positions. This embodiment shares other particulars with the second embodiment shown in FIG. 6.

First, the detection error counter 43 searches for the regions of the position data P(0) to P(n) stored in the registers 42 where positions PX lie. In case where the positions PX lie between P(m) and P(m+1), times tX corresponding to the set positions PX are obtained in accordance with times obtained by interpolation based on sampling position data P(m) and P(m+1), set positions PX, and sampling period Ts and the time m·Ts obtained by sampling the position data P(m).

A theoretical position PX' for the detection of the optional positions PX is obtained by linear interpolation using the following equation (4) based on the set positions PA and PB for the starting and ending points and the tA and tB corresponding to these positions:

$$PX'=PA+(PB-PA)\times(tX-tA)/(tB-tA) \quad (4)$$

Thus, a detection error DX involved when the optional positions PX are detected is given by the following equation (5):

$$DX = PX - PX' \quad (5)$$
$$= PX - [PA + (PB - PA) \times (tX - tA)/(tB - tA)].$$

Thereupon, setting in advance a plurality of optional positions PX (preferably, the positions PX are set at equal spaces), each detection error counter 43 carries out the computation of the above equation (5) for each set position PX, thereby obtaining the detection error DX. The set positions PX and the detection errors DX corresponding thereto are loaded as reference data into the corrective detection error register 51.

In the case of this third embodiment, moreover, the set positions PX are fixed positions, so that the plurality of detection errors DX corresponding to the set positions PX are loaded into the detection error storage register 44, an average of these detection errors DX corresponding to the set positions PX is taken by means of the leveling circuit 45, and average errors corresponding to the set positions PX as reference position data Ps are combined with the set position PX to be reference data. The reference data is loaded into the corrective detection error register 51.

The leveling circuit 45 can employ various methods, such as a method in which k number of detection errors are simply added and divided by k to obtain an average and a method in which average values are obtained by a filtering process such that a value obtained by dividing a newly obtained detection error D by k is added to a value obtained by multiplying an average Ds of previously obtained detection errors by $[(k-1)/k]$.

The detection errors DX corresponding to the individual set positions PX thus obtained are combined and loaded into the corrective detection error register 51. Based on the reference data stored in the corrective detection error register 51, the correction calculator 52 obtains the detection error D(x) for the position data P(x) delivered from the digital interpolator 3, corrects the position data P(x), and outputs it as position data for one period.

Figure 8:
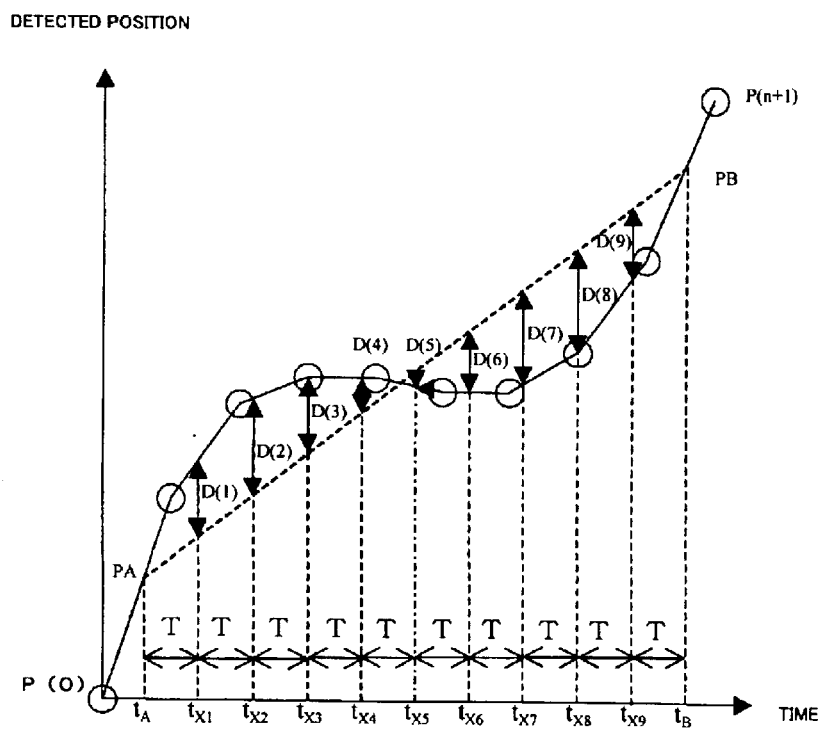
FIG. 8 is a diagram showing a fourth embodiment of the invention.

A fourth embodiment of the present invention will now be described with reference to FIG. 8.

In the third embodiment, optional positions in one period of the original signals are set so that detection errors for the set positions can be obtained as reference data. In the fourth embodiment, on the other hand, the region between a set starting position PA and ending position PB is equally divided by a given time interval T, and detection errors for detected position data for individual dividing points are obtained as reference data.

Times tA and tB corresponding to the starting and ending positions PA and PB can be obtained in the manner described in connection with the second embodiment. The interval from the time tA to tB is divided equal with the same divisional interval T. Times for the individual dividing points are given by tX1, tX2, tX3 . . . , individually. Theoretical positions in which the position data are to be detected at the individual dividing points can be obtained by interpolative calculation according to the same equation as the aforesaid equation (4) based on the positions PA and PB, times tA and tB for the positions, and times tXi (i=1, 2 . . . ) at the dividing points. Detected position data that is expected to be detected at each dividing point can be obtained in like manner by linear interpolation based on the sampling position data for the points precedent and next to the dividing point, sampling period Ts, starting time tA, and time tXi for the dividing point. Each detection error D(i) is obtained from the difference between a theoretical position for the dividing point and the detected position data that is expected to be detected at the dividing point.

The detected position data expected to be detected at the obtained dividing point and the detection error D(i) are paired and loaded into the corrective detection error storage register and used as reference data. Also in the case of this embodiment, the positions of the dividing points are fixed (because of fixed speed and fixed time interval T), an average of the detection errors corresponding to the detected position data expected to be detected at the individual dividing points may be obtained by means of the detection error storage register 44 and the leveling circuit 45 in the aforesaid manner. In this case, this average of the detection errors may be used as the reference detection error.

Figure 9:
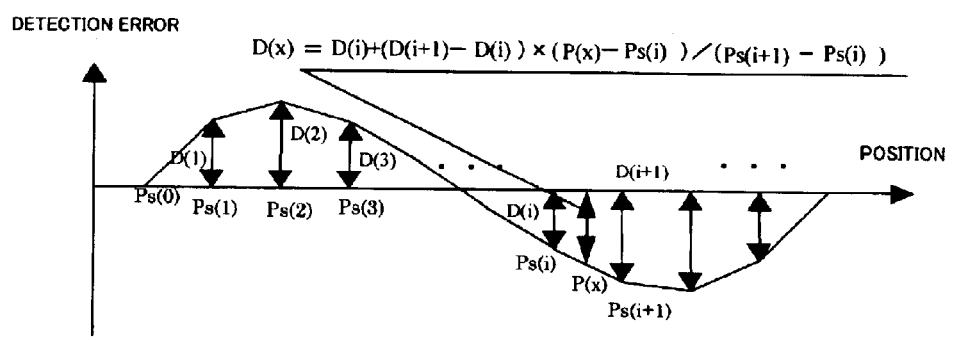
FIG. 9 is a diagram showing a correction method for correcting detected position data in accordance with reference data.

FIG. 9 is a diagram for illustrating correction that the correction calculator 52 carries out for the position data P(x)

delivered from the digital interpolator 3 in accordance with position data Ps(i) stored as reference data and the detection errors D(i) corresponding to the individual position data. The position data P(x) and the reference position data Ps(0) to Ps(n) stored in the corrective detection error register 51 are compared, and position data P(i) and Ps(i+1) precedent and next to the detected position data P(x) are obtained. Based on the reference position data Ps(i) and Ps(i+1) and detection error data D(i) and D(i+1) corresponding to these position data, the detection error D(x) for the detected position data P(x) is obtained by the interpolative computation of equation (6).

$$D(x)=D(i)+\{D(i+1)-D(i)\}\cdot\{P(x)-Ps(i)\}/\{Ps(i+1)-Ps(i)\}. \quad (6)$$

The correction calculator 52 subtracts the detection error D(x) thus obtained from the detected position data P(x) for correction and outputs the result.

In each of the embodiments described above, the detection error data calculator 4 is provided with the starting condition discriminator 41, and the starting condition discriminator 41 is used to fetch data for the registers 42 and output a reference data calculation command based on the determination of the starting condition discriminator 41. Alternatively, however, starting conditions may be determined by means of a controller, such as a numerical control device, for controlling a machine or apparatus fitted with the encoder, without using the starting condition discriminator 41. In this case, data are fetched from this controller, and the reference data calculation command is delivered from it.

Further, the position data delivered from the digital interpolator 3 may be corrected by the aforementioned method in a manner such that (n+1) number of consecutively detected position data P(0) to P(n) (n≧2) for at least three points in the aforesaid one period are obtained by means of position data acquiring means, a detection error for a third optional point P(x), which lies between P(0) to P(n), is obtained by frequency analysis using the position data group P(0) to P(n), and the obtained detection error data and the position for the obtained data are used as reference data.

The detection error data calculator 4 and the detection error correction circuit 5 may be formed of processors so that software serves for reference data origination and correction.

Figure 10:
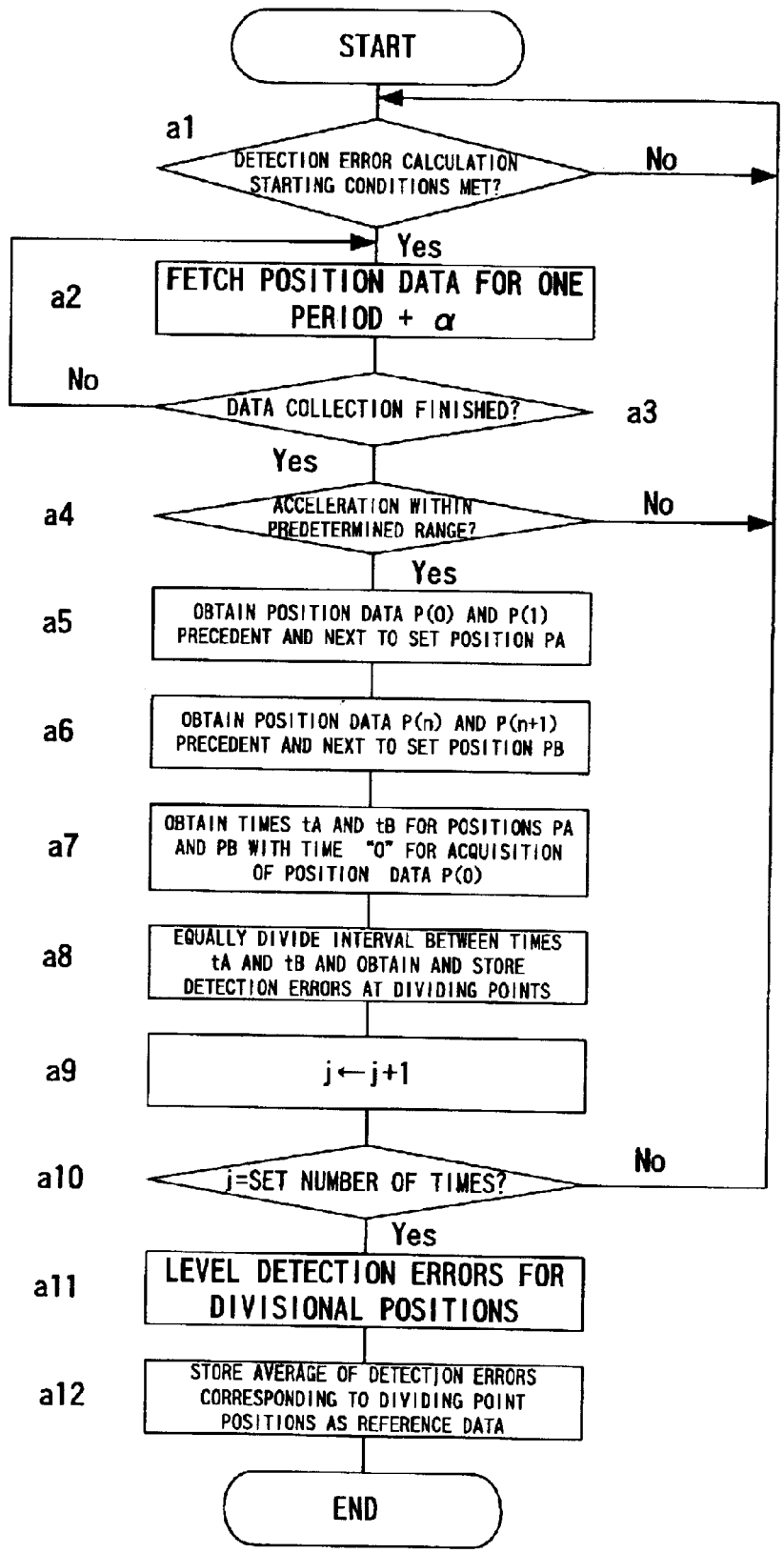
FIG. 10 is a flowchart showing processes according to an embodiment in which a processor is used to obtain reference data.

FIG. 10 is a flowchart showing processes (processes equivalent to the processes the detection error data calculator 4 executes) for obtaining the same reference data of the fourth embodiment using processors.

When a reference data origination command is first inputted manually or as a command from the controller for controlling the machine or apparatus fitted with the encoder, the processor determines whether or not set detection error calculation starting conditions are met in accordance with sampling position data delivered from the digital interpolator 3. Thus, whether or not the present speed is at a predetermined value and whether or not acceleration is within a predetermined range are determined (Step a1).

If it is concluded that the set detection error calculation starting conditions are met, the sampling position data delivered from the digital interpolator 3 for one or more periods are fetched (Steps a2 and a3). When this position data fetching is completed, whether or not the acceleration at the end of the one-period position data fetching is within the predetermined range (Step a4). If the acceleration is off the predetermined range, it implies that the speed is changed within the one period during which the position data are obtained. Accordingly, the program returns to Step a1, whereupon the position data are fetched again.

If it is concluded in Step a4 that the acceleration is within the predetermined range, the fetched position data are regarded as constant-speed data, and the position data P(0), P(1), P(n) and P(n+1), precedent and next to the data for the position PA set in accordance with the fetched position data and the set position PB one period behind the position PA, are obtained from the fetched position data (Steps a5 and a6). The times tA and tB for the positions PA and PB are obtained by interpolation in the aforesaid manner with the sampling time for the position data P(0) regarded as time "0" (Step a7).

The interval between the times tA and tB are equally divided, position data that are expected to be detected at the dividing points are obtained by interpolation, as mentioned before, detection errors for the expected detected positions are obtained, and the expected detected positions and their corresponding detection errors are stored correspondingly (Step a8).

An index j is incremented by 1 (the index j is initially set at "0"), and whether or not the value of the index j is equal to a set number of times is determined (Steps a9 and a10). If the value is not equal to the set number of times, the program returns to Step a1. Thereafter, the processes of Steps a1 to a10 are repeated. When the index j attains the set number of times, an average of j number of detection errors stored corresponding to the expected detected positions is obtained (Step a11). A set of the expected detected positions and the average of the detection errors are stored as reference data (Step a12), whereupon the process for acquiring the reference data is finished.

FIG. 11 is a flowchart showing processes (processes equivalent to the processes the detection error correction circuit 5 executes) for normal position detection by means of the encoder. The processor executes the processes shown in FIG. 11 with every given period.

The position data P(x), an output of the digital interpolator 3, is read (Step b1), and position data P(m) and P(m+1) precedent and next to the read position data P(x), out of position data to be stored as reference data (Step b2). The detection error data D(m) and D(m+1) that are stored corresponding to the obtained position data P(m) and P(m+1) are obtained (Step b3). Based on the position data P(m) and P(m+1) and the error data D(m) and D(m+1), the detection error D(x) for the read position data P(x) is obtained by interpolative computation (Step b4). The detection error D(x) is corrected with respect to the read position data P(x) and outputted as detected position data for one period (Step b5). Data values of a counter for counting the corrected detected position data and periods are outputted as position data.

What is claimed is:

1. A signal processing apparatus for an encoder, comprising:

position data acquiring means for sampling analog signals cyclically generated from an encoder coupled to an object to be measured with every given time in response to movement of said object to be measured and detecting and acquiring position data for said encoder;

storage means for obtaining error data corresponding to a plurality of detected position data from the individual detected position data and ideal position data obtained on the supposition that the position data linearly changes within each period of said analog signal and storing the detected position data and the error data as reference data; and correction means for obtaining detection error data by using the reference data stored in said storage means for the detected position data acquired by said position data acquiring means, thereby correcting the detected position data with use of the obtained detection error data, wherein said correction means obtains a detection error corresponding to the detected position data acquired by said position data acquiring means by interpolating the reference data stored in said storage means.

2. A signal processing apparatus for an encoder comprising position data acquiring means for sampling analog signals cyclically generated from an encoder coupled to an object to be measured with every given time in response to movement of said object to be measured and detecting and acquiring position data for said encoder;

storage means for obtaining error data corresponding to a plurality of detected position data from the individual detected position data and ideal position data obtained on the supposition that the position data linearly changes within each period of said analog signal and storing the detected position data and the error data as reference data; and correction means for obtaining detection error data by using the reference data stored in said storage means for the detected position data acquired by said position data acquiring means, thereby correcting the detected position data with use of the obtained detection error data, wherein said correction means obtains a detection error corresponding to the detected position data acquired by the position data acquiring means by interpolating position data precedent and next to the detected position data contained in said reference data and detection error data corresponding to said position data.

3. The signal processing apparatus for an encoder according to claim 1, which further comprises detection error data calculating means for setting and storing a combination of the detected position data and the detection error data corresponding to these detected position data as the reference data in said storage means, assuming that said detection error data is obtained as the difference between the ideal position data and the detected position data and said ideal position data is obtained on the supposition that position data linearly changes as the object to be measured moves from a predetermined position to a position corresponding to the lapse of one period.

4. The signal processing apparatus for an encoder according to claim 3, wherein said detection error data calculating means includes moving speed detecting means for obtaining the moving speed of the object to be measured and obtains said reference data when a predetermined speed is detected by means of said moving speed detecting means.

5. The signal processing apparatus for an encoder according to claim 3, wherein said position data acquiring means obtains the detection error data by acquiring (n+1) number of detected position data P(0) to P(n) (n≧2) for three or more points that divide said one period into at least two regions when said object to be measured is moving at a predetermined speed containing speed fluctuations below a predetermined level.

6. The signal processing apparatus for an encoder according to claim 5, wherein error data D(m) for m-th obtained position data P(m) (0<m<n) out of said (n+1) number of detected position data P(0) to P(n) (n≧2) is obtained according to the following equation:

$$D(m)=P(m)-[P(0)+\{P(n)-P(0)\}\times m/n].$$

7. The signal processing apparatus for an encoder according to claim 3, wherein said error data calculating means obtains a time tA for the passage of a set position PA from two consecutive position data P(0) and P(1) detected before and after the passage of the set position PA, obtains a time tB for the passage of a set position PB from two consecutive position data P(n) and P(n+1) detected before and after the passage of the set position PB ahead of the set position PA by said one period, and obtains detection error data D(m) for m-th detected position data P(m) (1<m<n) out of a detected position data group P(1) to P(n) according to the following equation:

$$D(m)=P(m)-[PA+(PB-PA)\times(tm-tA)/(tB-tA)],$$

where tm is the time when the position data is detected.

8. A signal processing apparatus for an encoder comprising:

position data acquiring means for sampling analog signals cyclically generated from an encoder coupled to an object to be measured with every given time in response to movement of said object to be measured and detecting and acquiring position data for said encoder;

storage means for obtaining error data corresponding to a plurality of detected position data from the individual detected position data and ideal position data obtained on the supposition that the position data linearly chances within each period of said analog signal and storing the detected position data and the error data as reference data;

correction means for obtaining detection error data by using the reference data stored in said storage means for the detected position data acquired by said position data acquiring means, thereby correcting the detected position data with use of the obtained detection error data; and detection error data calculating means for setting and storing a combination of the detected position data and the detection error data corresponding to these detected position data as the reference data in said storage means, by considering a plurality of position data, which is obtained on the supposition that position linearly changes with respect to time for one period from a predetermined position to a position corresponding to the lapse of one period, as ideal position data, and obtaining position data corresponding to said ideal position data from the detected position data, and then considering the difference between the obtained position data and said ideal position data as detected error data.

9. The signal processing apparatus for an encoder according to claim 8, wherein said detection error data calculating means includes moving speed detecting means for obtaining the moving speed of the object to be measured and obtains said reference data when a predetermined speed is detected by means of said moving speed detecting means.

10. The signal processing apparatus for an encoder according to claim 8, wherein said position data acquiring means obtains the detection error data by acquiring (n+1) number of detected position data P(0) to P(n) (n≧2) for three or more points that divide said one period into at least two regions when said object to be measured is moving at a predetermined speed containing speed fluctuations below a predetermined level.

11. The signal processing apparatus for an encoder according to claim 8, wherein said error data calculating means obtains a time tA for the passage of a set position PA from two consecutive position data P(0) and P(1) detected before and after the passage of the set position PA, obtains a time tB for the passage of a set position PB from two consecutive position data P(n) and P(n+1) detected before and after the passage of the set position PB ahead of the set position PA by said one period, obtains a time tX for the passage of an optional position PX from detected position data P(m) and P(m+1) which allow P(m)≦PX≦P(m+1) or P(m)≧PX≧P(m+1) to hold, obtains detection error DX for said position PX according to the following equation, obtains detection error data corresponding to a plurality of different positions for said optional position PX, and stores the detection error data corresponding to the individual positions PX as the reference data:

$$DX=PX-[PA+(PB-PA)\times(tX-tA)/(tB-tA)].$$

12. The signal processing apparatus for an encoder according to claim 11, wherein said error data calculating means divides the region between said position PA and the position PB into an optional number of equal parts, obtains the divisional positions and detection error data for the divisional positions, and set the detection error data corresponding to the divisional position data as the reference data.

13. A signal processing apparatus for an encoder comprising:

position data acquiring means for sampling analog signals cyclically generated from an encoder coupled to an object to be measured with every given time in response to movement of said object to be measured and detecting and acquiring position data for said encoder;

storage means for obtaining error data corresponding to a plurality of detected position data from the individual detected position data and ideal position data obtained on the supposition that the position data linearly changes within each period of said analog signal and storing the detected position data and the error data as reference data; and correction means for obtaining detection error data by using the reference data stored in said storage means for the detected position data acquired by said position data acquiring means, thereby correcting the detected position data with use of the obtained detection error data, wherein said position data acquiring means obtains (n+1) number of consecutively detected position data P(0) to P(n) (n≧2) for at least three points in said one period, obtains a detection error for a third optional point between P(0) to P(n) by frequency analysis, and corrects the position data in accordance with the obtained error data.

14. The signal processing apparatus for an encoder according to claim 9, wherein said speed detecting means detects speed by the difference between position data P(−1) for the last cycle of sampling and position data P(0) for the present cycle of sampling, and said detection error data calculating means obtains said reference data when a predetermined range is attained by said detected speed.

15. The signal processing apparatus for an encoder according to claim 9, wherein said error data calculating means includes means for obtaining acceleration from the difference between the difference between position data P(−1) for the last cycle of sampling and position data P(0) for the present cycle of sampling, detected by means of said speed detecting means, and the difference between position data P(−2) for the before-last cycle of sampling and the position data P(−1) for the last cycle of sampling, and obtains the reference data when predetermined ranges are attained by the detected speed and also by the detected acceleration, respectively.

16. The signal processing apparatus for an encoder according to claim 9, wherein said error data calculating means starts acquisition of the reference data when a predetermined range is attained by a difference V(0) between position data P(−1) for the last cycle of sampling and position data P(0) for the present cycle of sampling, a predetermined range is attained by the difference between said difference V(0) and a difference V(−1) between position data P(−2) for the before-last cycle of sampling and the position data P(−1) for the last cycle of sampling, and also predetermined ranges are attained by a difference V(n−1) between P(n−2) and P(n−1) and the difference V(n) between P(n−1) and P(n).

17. The signal processing apparatus for an encoder according to claim 8, wherein said error data calculating means starts acquisition of the reference data when an acquisition start command for said reference data is delivered from a controller for controlling the apparatus fitted with the encoder.

18. The signal processing apparatus for an encoder according to claim 8, wherein said detection error data stored as the reference data is an average of the detection error data calculated a plurality of times in the past or filtered data.

19. A signal processing apparatus for an encoder, comprising:

position data acquiring means for sampling analog signals cyclically generated from an encoder coupled to an object to be measured with every given time in response to movement of said object to be measured and detecting and acquiring position data for said encoder;

storage means for obtaining error data corresponding to a plurality of detected position data from the individual detected position data and ideal position data obtained on the supposition that the position data linearly changes within each period of said analog signal and storing the detected position data and the error data as reference data;

correction means for obtaining detection error data by using the reference data stored in said storage means for the detected position data acquired by said position data acquiring means, thereby correcting the detected position data with use of the obtained detection error data; and detection error data calculating means for setting and storing a combination of the detected position data and the detection error data corresponding to these detected position data as the reference data in said storage means, assuming that said detection error is obtained as the difference between the ideal position data and the detected position data and said ideal position data is obtained on the supposition that position data linearly changes as the object to be measured moves from a predetermined position to a position corresponding to the lapse of one period.

* * * * *

UNITED STATES PATENT AND TRADEMARK OFFICE
CERTIFICATE OF CORRECTION

PATENT NO. : 6,956,505 B2
APPLICATION NO. : 10/334791
DATED : October 18, 2005
INVENTOR(S) : Mitsuyuki Taniguchi et al.

It is certified that error appears in the above-identified patent and that said Letters Patent is hereby corrected as shown below:

column 14, line 13 delete "(1<m<n)" and insert --(1≤m≤n)

column 14, line 30 delete "chances" and insert --changes-- column 16, line 2 after "difference between" delete "the difference between"

column 16, line 7 delete "sampling," and insert --sampling and the position data P(-1) for the last cycle of sampling,--

Signed and Sealed this

First Day of August, 2006

JON W. DUDAS
*Director of the United States Patent and Trademark Office*